(12) United States Patent
Burghartz et al.

(10) Patent No.: US 11,257,915 B2
(45) Date of Patent: Feb. 22, 2022

(54) SEMICONDUCTOR ELEMENT HAVING AN ENHANCEMENT-TYPE TRANSISTOR STRUCTURE

(71) Applicant: Institut für Mikroelektronik Stuttgart, Stuttgart (DE)

(72) Inventors: Joachim N. Burghartz, Leinfelden-Echterdingen (DE); Mohammed Alomari, Stuttgart (DE); Muhammad Alshahed, Stuttgart (DE)

(73) Assignee: Institut für Mikroelektronik Stuttgart, Stuttgart (DE)

( * ) Notice: Subject to any disclaimer, the term of this patent is extended or adjusted under 35 U.S.C. 154(b) by 0 days.

(21) Appl. No.: 16/868,412

(22) Filed: May 6, 2020

(65) Prior Publication Data

US 2020/0373399 A1   Nov. 26, 2020

Related U.S. Application Data

(63) Continuation of application No. PCT/EP2018/080166, filed on Nov. 5, 2018.

(30) Foreign Application Priority Data

Nov. 6, 2017   (DE) .................... 10 2017 125 803.5

(51) Int. Cl.
*H01L 29/423* (2006.01)
*H01L 29/778* (2006.01)
(Continued)

(52) U.S. Cl.
CPC ...... *H01L 29/4236* (2013.01); *H01L 29/7786* (2013.01); *H01L 29/2003* (2013.01); *H01L 29/205* (2013.01)

(58) Field of Classification Search
CPC ............ H01L 29/4236; H01L 29/7786; H01L 29/2003; H01L 29/205
See application file for complete search history.

(56) References Cited

U.S. PATENT DOCUMENTS 7,728,356 B2   6/2010   Suh et al.
7,932,539 B2   4/2011   Chen et al.
(Continued)

FOREIGN PATENT DOCUMENTS

DE   10 2011 000 911 A1   9/2011
DE   10 2013 102 156 A1   5/2014
(Continued)

OTHER PUBLICATIONS

Kota Ohi et al.; Current Stability in Multi-Mesa-Channel AlGaN/GaN HEMTs; IEEE Transactions on Electron Devices; vol. 60, No. 10; Oct. 2013; 10 pages.

(Continued)

*Primary Examiner* — Fernando L Toledo
*Assistant Examiner* — Valerie N Newton
(74) *Attorney, Agent, or Firm* — Harness, Dickey & Pierce, P.L.C.

(57) ABSTRACT

A semiconductor element includes an enhancement-type transistor structure with a layer construction including a base substrate, a first semiconductor layer, and a second semiconductor layer, which are arranged one on top of the other along a first direction. The transistor structure further has a source electrode, a gate electrode, and a drain electrode, which are spaced apart from one another along a second direction that is transverse to the first direction. The first and second semiconductor layers are formed by different group III nitride materials, such that a 2D electron gas forms in a boundary region of the first and second semiconductor layers. The first and second semiconductor layers have holes (Continued)

in the region of the gate electrode, between which holes multiple fins including the group III nitride materials remain. The gate electrode has a plurality of gate fingers extending into the holes.

19 Claims, 1 Drawing Sheet

(51) Int. Cl.
*H01L 29/20* (2006.01)
*H01L 29/205* (2006.01)

(56) References Cited

U.S. PATENT DOCUMENTS

| | | | |
|---|---|---|---|
| 8,114,726 | B2 | 2/2012 | Marui et al. |
| 8,890,168 | B2 | 11/2014 | Lidow et al. |
| 8,890,206 | B2 | 11/2014 | Yamada |
| 8,933,489 | B2 | 1/2015 | Kikkawa |
| 2007/0278518 | A1 | 12/2007 | Chen et al. |
| 2008/0093626 | A1* | 4/2008 | Kuraguchi .......... H01L 29/2003 257/190 |
| 2008/0296618 | A1 | 12/2008 | Suh et al. |
| 2009/0065810 | A1* | 3/2009 | Honea .............. H01L 29/42316 257/192 |
| 2010/0219452 | A1 | 9/2010 | Brierley |
| 2011/0073912 | A1 | 3/2011 | Marui et al. |
| 2011/0266557 | A1 | 11/2011 | Mieczkowski et al. |
| 2012/0098599 | A1 | 4/2012 | Chang et al. |
| 2013/0168687 | A1 | 7/2013 | Kuo et al. |
| 2013/0237021 | A1 | 9/2013 | Derluyn et al. |
| 2014/0015011 | A1 | 1/2014 | Khan et al. |
| 2015/0249134 | A1 | 9/2015 | Ostermaier et al. |
| 2017/0179270 | A1 | 6/2017 | Tanimoto |

FOREIGN PATENT DOCUMENTS

| | | |
|---|---|---|
| DE | 10 2015 103 017 A1 | 9/2015 |
| JP | 2010 114219 A | 5/2010 |
| WO | WO-2008151138 A1 | 12/2008 |

OTHER PUBLICATIONS

Chandan Yadav et al.; Modeling of GaN-Based Normally-Off FinFET; IEEE Electron Device Letters; vol. 35, No. 6; Jun. 2014; 4 pages.

Ki-Sik Kim et al.; Heterojunction-Free GaN Nanochannel FinFETs With High Performance; IEEE Electron Device Letters; vol. 34, No. 3; Mar. 2013; 4 pages.

Dong-Hyeok Son et al.; Fabrication of high performance AlGaN/GaN FinFET by utilizing anisotropic wet etching in TMAH solution; Solid State Device Research Conference (ESSDERC); Sep. 14-18, 2015; Graz, Austria; 4 pages.

\* cited by examiner

SEMICONDUCTOR ELEMENT HAVING AN ENHANCEMENT-TYPE TRANSISTOR STRUCTURE

CROSS-REFERENCE TO RELATED APPLICATIONS

This application is a continuation of International Application No. PCT/EP2018/080166 filed Nov. 5, 2018, which claims priority to German Application No. 10 2017 125 803.5 filed Nov. 6, 2017. The entire disclosures of the applications referenced above are incorporated by reference.

FIELD

The present disclosure relates to semiconductor devices and more particularly to an enhancement-type transistor structure.

BACKGROUND

The present disclosure relates to a semiconductor element comprising an enhancement-type transistor structure. More particularly, the disclosure relates to an enhancement-type transistor structure comprising a first group III nitride material and a second group III nitride material and employing fins in a region of a gate electrode.

Even more particularly, the disclosure relates to a so-called High Electron Mobility Transistor (HEMT), i.e. a transistor which, on account of its design and the materials used, has a high electron mobility and thus enables short switching times. HEM transistors are a special design of so-called field effect transistors. The latter have a channel between the source electrode and the drain electrode, in which channel a current can flow from the source electrode to the drain electrode. With the aid of a voltage at the gate electrode, the current flow through the channel can be influenced, in particular suppressed or actually made possible in the first place. If a layer construction composed of two semiconductor materials having different Fermi levels and band gaps of different magnitudes is used in the region between the source electrode and the drain electrode, a so-called two-dimensional electron gas (2DEG) can form in the boundary region of the materials. The 2D electron gas can serve as a conductive channel between the source electrode and the gate electrode. The electron mobility in the channel thus formed is very high.

Aluminum gallium arsenide (AlGaAs) and gallium arsenide (GaAs) are often used as different semiconductor materials for the layer construction of a HEM transistor. However, the HEMT principle is also realizable with other semiconductor layers and relatively recently attention has been focused on material combinations comprising gallium nitride (GaN) and/or other compound semiconductors comprising nitrogen and at least one element of main group III of the Periodic Table (generally referred to as group III nitride materials hereinafter). Gallium nitride and other group III nitride materials have a large band gap between the valence band and the conduction band and are therefore very well suited to switching high voltages. For this reason, GaN HEM transistors are outstandingly suitable both for applications in power electronics and for applications in radio-frequency electronics.

In the case of field effect transistors including HEM transistors, a distinction is drawn between two different basic types. Enhancement-type transistors are also referred to as normally-off transistors. What is characteristic of this type of transistor is that the channel for a current flow between the source electrode and the drain electrode only forms when a voltage is applied to the gate electrode. Conversely, in the case of depletion-type transistors (normally-on), a channel present between source electrode and drain electrode is pinched off by application of a gate voltage.

As mentioned above, a 2D electron gas forms at the boundary between two semiconductor materials having greatly different band gaps, which 2D electron gas can serve as a conductive channel between source electrode and drain electrode. For this reason, it is relatively simple to produce a depletion-type HEM transistor.

By contrast, the production of an enhancement-type HEM transistor requires additional steps and additional technological outlay in order to prevent the 2D electron gas from arising in the region of the gate electrode without gate potential. One approach is local etching back or thinning of the second semiconductor layer below the metallic gate contact. Examples of this approach may be found in DE 10 2011 000 911 A1, DE 10 2013 102 156 A1, U.S. Pat. No. 8,114,726 B2, US 2010/0219452 A1, US 2011/0073912 A1, US 2013/0237021 A1 and US 2014/0015011 A1. Local etching back of the semiconductor layer, which is thin anyway, is difficult, however, and requires very exact control of the etching process.

A second approach, which is favored from a present-day standpoint, uses an additional p-doped and thus conductive semiconductor layer between the metallic gate electrode and the layer construction serving for forming the 2D electron gas. The p-doped layer results in a potential shift and thus in a suppression of the 2DEG channel in the region of the gate electrode. What is disadvantageous in this case is that the p-doped layer has to be completely removed by etching outside the gate region, but the 2DEG channel closely below the gate must not be allowed to be damaged by overetching. Examples of this approach may be found in U.S. Pat. Nos. 7,728,356 B2, 8,890,168 B2, 8,890,206 B2, 8,933,489 B2, US 2008/0296618 A1 or WO 2008/151138 A1.

A third approach uses the implantation of fluorine into the semiconductor layer below the gate electrode or an oxygen plasma treatment of this layer before the gate dielectric is applied. Examples of this approach may be found in U.S. Pat. No. 7,932,539 B2, US 2007/0278518 A1 and US 2012/0098599 A1. A disadvantage of this approach is the lack of long-term stability.

A fourth approach is based on subdividing the semiconductor layers into strips in the region between the source electrode and the drain electrode. This approach involves etching trenches into the first and second semiconductor layers. "Ridges" or webs referred to as fins remain between the trenches. The channel between the source electrode and the gate electrode runs in the fins and the gate potential can then also act on the channel laterally. Potential conditions that enable an enhancement-type transistor structure arise in this way. In contrast to the etching back in the approach mentioned first, the etching of the trenches is noncritical with regard to the etching depth. What is disadvantageous is that the conductivity of the channel is adversely affected by the high degree of structuring and the electrical resistance in the conductive state is increased.

As an example of a transistor structure having fins, reference should be made to the publication Chandan Yadav et al. *"Modeling of GaN-Based Normally-Off FinFET"*, in IEEE Electron Device Letters, Vol. 35, No. 6, June 2014, to the publication Ki-Sik Kim et al. *"Heterojunction-Free GaN Nanochannel FinFETs With High Performance"*, IEEE Electron Device Letters, Vol. 34, No. 3, March 2013, and to the publication Dong-Hyeok Son et al. "*Fabrication of high performance AlGaN/GaN FinFET by utilizing anisotropic wet etching in TMAH solution*", published on the occasion of the Solid State Device Research Conference (ESSDERC) from Sep. 14 to 18, 2015, Graz, Austria.

Finally, DE 10 2015 103 017 A1 discloses a plurality of example embodiments of an enhancement-type transistor structure having fins. In some example embodiments, the length of the fins and trenches is shorter than the distance between source electrode and drain electrode. In one example embodiment, in addition to the fins in the region of the gate electrode, there is a second group of fins, above which the metallization of the source electrode extends. In all the example embodiments, a p-doped material is arranged between the gate electrode and the layer construction of the fins. Consequently, DE 10 2015 103 017 A1 combines the second and fourth approaches.

SUMMARY

Against this background, it is an object of the present disclosure to provide a semiconductor element of the type mentioned in the introduction which avoids or at least reduces the disadvantages mentioned above. In particular, it is an object of the disclosure to provide a semiconductor element comprising an enhancement-type transistor structure which can be produced with a reduced lithographic outlay and/or a higher yield and thus more cost-effectively.

In accordance with one aspect, there is provided a semiconductor element comprising an enhancement-type transistor structure, wherein the transistor structure has a layer construction comprising a base substrate, a first semiconductor layer and a second semiconductor layer, which are arranged one on top of the other along a first direction, wherein the transistor structure further has a source electrode, a gate electrode and a drain electrode, which are spaced apart from one another along a second direction that is transverse to the first direction, wherein the first semiconductor layer is formed by a first group III nitride material arranged on the base substrate, wherein the second semiconductor layer is formed by a second group III nitride material arranged on the first layer, wherein the first and second group III nitride materials differ from one another, such that a 2D electron gas forms in a boundary region of the first and second semiconductor layers, wherein the first semiconductor layer and the second semiconductor layer each have a plurality of holes in the region of the gate electrode, between which holes a plurality of fins comprising the first and second group III nitride materials remain, wherein the gate electrode has a plurality of gate fingers extending into the plurality of holes, wherein the plurality of holes form a first row of holes and a second row of holes, wherein the first row of holes and the second row of holes each run transversely with respect to the first direction and the second direction, thus defining a third direction, and wherein holes of the second row of holes are offset relative to holes of the first row of holes in the second direction and in the third direction.

According to one aspect, the novel transistor structure uses a layer construction which is structured by holes and fins in the region of the gate electrode in order to suppress the 2DEG channel formed by the layer construction and to obtain an enhancement-type transistor structure. Since the gate fingers of the gate electrode reach into the layer construction, the potential conditions change and a depletion zone forms around the gate fingers. The depletion zone disturbs the formation of the 2D electron gas. In various example embodiments, the holes with the gate fingers are arranged at relative distances from one another which are chosen such that the channel between source electrode and drain electrode is pinched off without an applied gate potential.

In contrast to fin transistors from the prior art, the novel semiconductor element has at least two rows of holes with gate fingers, wherein the holes of the rows of holes are offset relative to one another such that the remaining fins no longer run through rectilinearly in the second direction, but rather are interrupted or at least constricted/narrowed. At the same time, however, the offset holes of the second row of holes form further fins, which are offset relative to the fins of the first row of holes. This type of structuring enables a lower hole or trench density in comparison with the prior art and thus wider fins. The lower hole density results in a lower outlay during structuring and enables a more cost-effective realization. Moreover, the wider fins on account of the larger hole distances enable a lower electrical resistance in the conducting or enhanced state. A further advantage resides in the noncritical etching of the holes through the 2D electron gas, thus resulting in an improved reproducibility and a higher yield in production. The object mentioned above is therefore achieved in its entirety.

In a various configurations, the first and second rows of holes run parallel to one another.

In principle, it is possible for the first and second rows of holes to run obliquely with respect to one another and to form an angle of 10°, for example. By comparison therewith, various configuration have the advantage that the holes with the gate fingers and the fins are arranged and spaced apart from one another uniformly in the smallest possible region below the gate electrode. Advantageously, with this configuration it is possible to achieve homogenous channel properties over the channel width in the third direction.

In a further configuration, the holes form a third row of holes, wherein the holes of the third row of holes are offset relative to the holes of the second row of holes in the second direction and in the third direction. Preferably, the holes of the first row of holes and of the second row of holes are aligned with one another in the second direction, such that the holes of the first row of holes and of the third row of holes form further rows of holes in the second direction. Furthermore, in various example embodiments, the holes form rows of holes which run obliquely with respect to the second and third directions.

This configuration enables particularly simple structuring of the first and second semiconductor layers. The relative distances between the gate fingers can once again be increased and the hole density can be reduced further.

In a further configuration, the fins between the holes of the first row of holes and the fins between the holes of the second row of holes are offset in the third direction in each case by a distance corresponding to half of the sum of hole diameter and hole distance in the second direction. In various example embodiments, the hole diameter and the hole distance in the second direction are moreover identical.

In various example embodiments of this configuration, the holes of the second row of holes, in the third direction, are arranged practically centrally between in each case two holes of the first row of holes. This configuration advantageously contributes to minimizing the hole density and to reducing the lithography outlay. Moreover, this configuration enables a very uniform field effect of the gate electrode on the 2D electron gas. Generally, this configuration has the advantage that the hole distances between adjacent holes can be chosen to be relatively large.

In a further advantageous configuration, a first hole distance between two adjacent holes of the first row of holes is equal to a second hole distance between two adjacent holes of the second row of holes. Furthermore, in various implementations, a further hole distance between a hole of the first row of holes and an adjacent hole of the second row of holes is equal to the first hole distance between two adjacent holes of the first row of holes.

These configurations likewise contribute to a very uniform field effect of the gate electrode on the 2D electron gas, while they simplify the structuring of the first and second semiconductor layers.

In a further configuration, the hole distance between adjacent holes is in the range of 50 nm to 150 nm, preferably in a range up to 100 nm. In accordance with a further advantageous configuration, the holes have in the second direction a hole diameter which is in a range of 50 nm to 150 nm, preferably in a range up to 100 nm.

In investigations of the novel transistor structure, hole distances and hole diameters of this order of magnitude have proved to be advantageous for a particularly cost-effective realization of an enhancement-type HEM transistor.

In a further configuration, the holes in the region of the gate electrode form a cumulated hole cross-sectional area and the fins in the region of the gate electrode form a cumulated fin cross-sectional area, wherein the cumulated hole cross-sectional area and the cumulated fin cross-sectional area are approximately equal in magnitude. "Approximately equal in magnitude" here means that the fin cross-sectional area occupies between 40% and 60% of the area below the gate electrode, and is preferably in the region of approximately 50% of the total area below the gate electrode.

The cumulated hole cross-sectional area is the sum of the hole cross sections in the region of the gate electrode. The cumulated fin cross-sectional area is the total area of the remaining fins in the region of the gate electrode. In various configurations, the holes are large enough to introduce the metal of the gate electrode and—in various example embodiments—an insulating dielectric. On the other hand, the remaining fins are large enough to enable an effective current conduction in the on (enhanced) state of the transistor.

In a further configuration, the holes are lined with an electrically insulating dielectric. Preferably, the holes are completely lined with the insulating dielectric.

In this configuration, the metallic gate fingers of the gate electrode are isolated from the group III nitride material of the first and second semiconductor layers by the dielectric. Advantageously, this configuration in various example embodiments dispenses with an additional p-doped material which, in the case of transistor structures according to the prior art, often provides a conductive connection between the gate electrode and selected portions of the channel material. The configuration enables a particularly cost-effective realization and a maximization of the hole distances. It furthermore contributes to enabling high breakdown field strengths for applications in power electronics.

In a further configuration, fins are laterally bounded in each case by two insulated gate fingers in the third direction.

In this configuration, a gate finger is in each case arranged on the left and on the right of each fin. As an alternative thereto, in other configurations it is possible to bound selected fins laterally with a p-doped or n-doped material and/or to realize conductive connections to the source electrode or drain electrode. This configuration contributes to a particularly simple and cost-effective realization of the novel semiconductor element.

In a further configuration, the holes are—at least approximately—circular.

This configuration is particularly advantageous if the holes are produced with the aid of electron beam lithography. Largely circular (circular-cylindrical) holes can be produced more easily with the small dimensions. In some configurations, the rows of holes can alternatively or supplementarily be produced with the aid of so-called nano-imprint lithography (NIL). In this case, a structured stamp is used to produce the structuring of the photoresist for the lithography process. In various example embodiments with this variant, different hole cross sections including non-circular hole cross sections are possible.

In various configurations, the novel semiconductor element has the advantage that the 2D electron gas is interrupted by gate fingers only where the field effect of the gate electrode is effectively required. Accordingly, in various example embodiments, the semiconductor element has holes only in the region of the gate electrode, which holes have an effect like fins as a result of the close arrangement and the remaining material webs, but at the same time increase the channel resistance in the on state to a lesser extent. In various example embodiments, the remaining channel region between the source electrode and the gate electrode is "hole-free", that is to say not structured in the manner described. In some example embodiments, the non-structured channel region in the second direction is more than double the size of the region structured by holes and fins.

It goes without saying that the features mentioned above and those yet to be explained below can be used not only in the combination respectively indicated, but also in other combinations or by themselves, without departing from the scope of the present disclosure.

BRIEF DESCRIPTION OF THE DRAWINGS

Example embodiments of the disclosure are illustrated in the drawings and are explained in greater detail in the following description. In the drawings.

DETAILED DESCRIPTION

Figure 1:
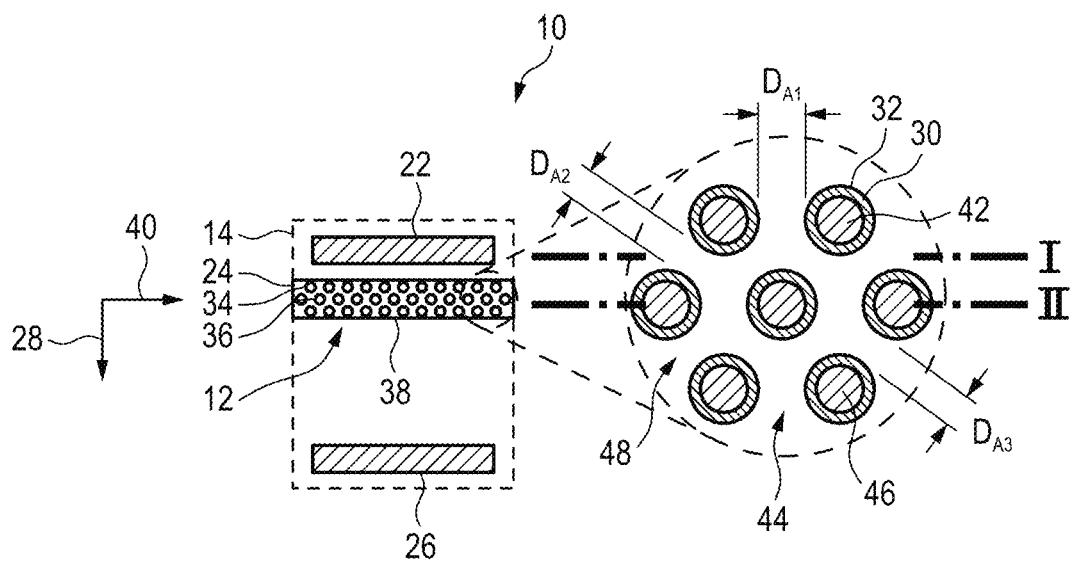
FIG. 1 shows a simplified illustration of one example embodiment of the novel semiconductor element in a view from above.

In FIG. 1, an example embodiment of the novel semiconductor element is designated in its entirety by reference numeral 10. The semiconductor element includes a transistor structure 12, which is constructed on a base substrate 14. As is illustrated schematically with reference to FIG. 2, a layer construction comprising a first semiconductor layer 16 and a second semiconductor layer 18 is arranged on the base substrate 14.

The first semiconductor layer 16 is produced with a group III nitride material and can be a GaN layer, for example, which is grown epitaxially onto the base substrate 14. The second semiconductor layer 18 is a group III nitride material which differs from the group III nitride material of the first semiconductor layer 16. By way of example, the second semiconductor layer 18 is produced with an AlGaN material which is grown epitaxially onto the first semiconductor layer 16. Optionally, in various example embodiments, a third layer (not illustrated here) can be arranged between the second semiconductor layer 18 and the first semiconductor layer 16, wherein the third layer advantageously serves for adapting the first and second semiconductor layers or "smooths" the transition from the first semiconductor layer to the second semiconductor layer. By way of example, the adapting layer for the material combination mentioned above can be produced from aluminum nitride (AlN).

As already mentioned in the introduction, in principle other compound semiconductors comprising nitride and a group III material can also be used. The group III nitride material of the first semiconductor layer 16 and the group III nitride material of the second semiconductor layer 18 have different Fermi levels or different band gaps. Consequently, in the boundary region of the semiconductor layers 16, 18, a 2D electron gas 19 forms, i.e. a layer having a plurality of "free" electrons which can move in two lateral dimensions in the boundary region. As illustrated on the basis of the arrow 20 in FIG. 2, the layer construction defines a first direction and the mobility of the electrons in the boundary region of the semiconductor layers 16, 18 is substantially orthogonal to the first direction 20.

Figure 2:
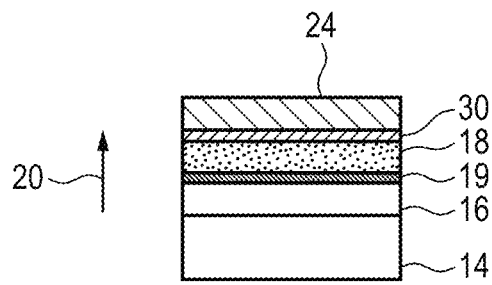
FIG. 2 shows a sectional view through the semiconductor element from FIG. 1 along the line I.

Referring to FIG. 1, the semiconductor element has a source electrode 22, a gate electrode 24 and a drain electrode 26, which are arranged and spaced apart from one another along a second direction 28. The electrodes are typically produced from a metallic material that is deposited on the semiconductor layer construction. FIG. 2 shows the metal layer of the gate electrode 24 above an insulating dielectric 30. The dielectric 30 can be an oxide layer, for example, which is formed on the second semiconductor layer 18.

Figure 3:
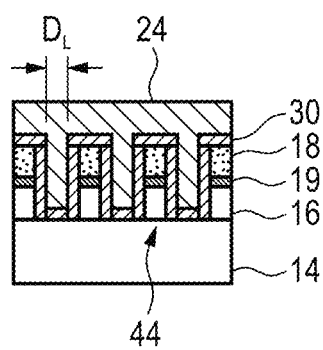
FIG. 3 shows a sectional view through the semiconductor element from FIG. 1 along the line II.

Referring to FIGS. 1 and 3, a plurality of holes 32 are etched in the region of the gate electrode 24. The holes 32 extend along the first direction 20 into the depth of the layer construction comprising the first and second semiconductor layers 16, 18. In various example embodiments, the holes 32 are produced by local etching back of the group III nitride materials. The depth of the holes 32 is preferably greater than the height of the layer construction comprising the two group III nitride materials. In some example embodiments, the depth of the holes 32 can be greater than 30 nm, for example, while the layer construction comprising the group III nitride materials has a height of approximately 30 nm. Generally, the holes 32 can thus have in the direction 20 a depth extending as far as the base substrate 14 or even into the base substrate 14.

As can be seen in FIG. 1, the holes 32 here are arranged in rows of holes 34, 36, 38 parallel to one another, the rows of holes extending transversely with respect to the second direction 28 in a third direction 40. In various example embodiments, the rows of holes 34, 36, 38 run orthogonally to the second direction 28 and preferably orthogonally to the first direction 20.

As can be discerned in FIG. 3, the holes 32 here are lined in each case with the insulating dielectric 30. In various example embodiments, the dielectric 30 is formed on the second semiconductor layer 18 after the holes 32 have been produced by means of an etching process. In a later step, the metal layers of the electrodes 22, 24, 26 are applied. By means of this later step, the holes 32 are filled with the metallic material of the gate electrode 24, thus giving rise to metallic gate fingers 42 extending into the holes 32. Preferably, the gate fingers 42 together with the dielectric 30 completely fill the holes 32. The layer construction comprising the first and second semiconductor layers 16, 18 and the 2D electron gas 19, which layer construction remains between the holes 32, forms webs or fins in which a current flow from the source electrode 22 to the drain electrode 26 is possible.

In contrast to transistor structures comprising fins according to the prior art, the fins 44 here do not run through to the drain electrode in a straight fashion in the second direction 28 because the holes of the second row of holes 34 are offset relative to the holes of the first row of holes 34 and relative to the holes of the third row of holes 38 in the third direction 40, as is illustrated in FIG. 1.

In various example embodiments, the holes 32 are just large enough in their diameter to be able to introduce the relatively thin dielectric 30 and the metal of the gate electrode 24. Since, in the conducting (enhanced) state of the transistor structure 12, the holes 32 block the current flow from the source electrode 22 to the drain electrode 26 and thus increase the resistance $R_{on}$, it is desirable to make the holes 32 as small as possible. In various example embodiments, a hole diameter $D_L$ which is in a range of 50 nm to 100 nm has proved to be advantageous. In various example embodiments, the hole distance $L_{A1}$ between two adjacent holes of a row of holes is likewise between 50 nm and 100 nm. Furthermore, the hole distance $D_{A2}$ between two adjacent holes of different rows of holes in various example embodiments is also in the range of between 50 nm and 100 nm. In various example embodiments, the hole distances $D_{A1}$ and $D_{A2}$ are identical (within the scope of the production tolerances).

In the example embodiment illustrated here, the holes 32 have a largely circular cross section, although a mathematically exact circular shape is seldom attained on account of production tolerances and process instabilities. In other example embodiments (not illustrated here), the holes 32 can have a different cross section, for example elongate oval, square, hexagonal, octagonal, rectangular, or some other cross-sectional shape, which can even turn out to be irregular. In the example embodiments mentioned above, the hole diameter $D_L$ is preferably measured in the third direction 40. In the second direction 28, the hole diameter can be larger or smaller. It is preferably approximately identical in the second direction 28 and in the third direction 40.

In various example embodiments, the sum of the hole cross-sectional areas in the region of the gate electrode 24 is approximately equal to the sum of the remaining fin cross-sectional areas 48. Moreover, the structuring of the layer construction by the holes 32 and fins 44 in various example embodiments is restricted to the region below the gate electrode 24, as is illustrated in FIG. 1. Away from the gate electrode 24, the channel region between the source electrode 22 and the drain electrode 26 is preferably unstructured in order to foster a largely undisturbed current flow between source electrode 22 and drain electrode 26.

The phrase at least one of A, B, and C should be construed to mean a logical (A OR B OR C), using a non-exclusive logical OR, and should not be construed to mean "at least one of A, at least one of B, and at least one of C."

What is claimed is:

1. A semiconductor element comprising:
an enhancement-type transistor structure,
wherein the transistor structure has a layer construction comprising a base substrate, a first semiconductor layer, and a second semiconductor layer, which are arranged one on top of the other along a first direction,
wherein the transistor structure further has a source electrode, a gate electrode, and a drain electrode, which are spaced apart from one another along a second direction that is transverse to the first direction, wherein the first semiconductor layer is formed by a first group III nitride material arranged on the base substrate, wherein the second semiconductor layer is formed by a second group III nitride material arranged on the first layer, wherein the first and second group III nitride materials differ from one another, such that a 2D electron gas forms in a boundary region of the first and second semiconductor layers, wherein the first semiconductor layer and the second semiconductor layer each have a plurality of holes in the region of the gate electrode, between which holes a plurality of fins comprising the first and second group III nitride materials remain, wherein the gate electrode has a plurality of gate fingers extending into the plurality of holes, wherein the plurality of holes form a first row of holes and a second row of holes, wherein the first row of holes and the second row of holes each run transversely with respect to the first direction and the second direction, thus defining a third direction, and wherein holes of the second row of holes are offset relative to holes of the first row of holes in the second direction and in the third direction.

2. The semiconductor element of claim 1, wherein the first row of holes and the second row of holes run parallel to one another.

3. The semiconductor element of claim 1, wherein:
the plurality of holes form a third row of holes and
holes of the third row of holes are offset relative to holes of the second row of holes in the second direction and in the third direction.

4. The semiconductor element of claim 1, wherein the fins between holes of the first row of holes and the fins between holes of the second row of holes are offset in the third direction in each case by a distance corresponding to half of a sum of hole diameter and a hole distance in the second direction.

5. The semiconductor element of claim 1, wherein a first hole distance between two adjacent holes of the first row of holes is equal to a second hole distance between two adjacent holes of the second row of holes.

6. The semiconductor element of claim 1, wherein a further hole distance between a hole of the first row of holes and an adjacent hole of the second row of holes is equal to a first hole distance between two adjacent holes of the first row of holes.

7. The semiconductor element of claim 1, wherein a hole distance between adjacent holes is in a range of 50 nm to 150 nm.

8. The semiconductor element of claim 7, wherein the hole distance between adjacent holes is less than or equal to 100 nm.

9. The semiconductor element of claim 1, wherein the plurality of holes each have in the third direction a hole diameter that is in a range of 50 nm to 150 nm.

10. The semiconductor element of claim 9, wherein the hole diameter in the third direction is less than or equal to 100 nm.

11. The semiconductor element of claim 1, wherein:
the plurality of holes form a cumulative hole cross-sectional area in the region of the gate electrode,
the plurality of fins form a cumulative fin cross-sectional area in the region of the gate electrode, and
the cumulative hole cross-sectional area and the cumulative fin cross-sectional area are approximately equal in magnitude.

12. The semiconductor element of claim 1, wherein the plurality of holes are lined with an electrically insulating dielectric.

13. The semiconductor element of claim 1, wherein the plurality of fins are laterally bounded in each case by two insulated gate fingers in the third direction.

14. The semiconductor element of claim 1, wherein the plurality of holes are circular.

15. A semiconductor element comprising:
a base substrate;
a first semiconductor layer arranged on the base substrate;
a second semiconductor layer arranged on the first semiconductor layer;
a source electrode;
a gate electrode; and
a drain electrode,
wherein:
the base substrate, the first semiconductor layer, and the second semiconductor layer are arranged on top of each other along a first direction,
the source, gate, and drain electrodes are spaced apart from one another along a second direction that is transverse to the first direction,
the first semiconductor layer is formed by a first group III nitride material,
the second semiconductor layer is formed by a second group III nitride material,
the first and second group III nitride materials differ from one another,
a plurality of holes through the first semiconductor layer and the second semiconductor layer are present in a region of the gate electrode,
the gate electrode has a plurality of gate fingers extending into the plurality of holes,
the plurality of holes form a first row of holes and a second row of holes, and
the first row of holes and the second row of holes each run transversely with respect to the first direction and the second direction, thus defining a third direction.

16. The semiconductor element of claim 15 wherein holes of the second row of holes are offset relative to holes of the first row of holes in the second direction and in the third direction.

17. The semiconductor element of claim 16, wherein:
the plurality of holes also forms a third row of holes and
holes of the third row of holes are offset relative to the holes of the second row of holes in the second direction and in the third direction.

18. The semiconductor element of claim 15 wherein:
the plurality of holes form a cumulative hole cross-sectional area in the region of the gate electrode and
the cumulative hole cross-sectional area is approximately half a cross-sectional area of the gate electrode.

19. The semiconductor element of claim 15 wherein each of the plurality of holes extends through an entirety of the first semiconductor layer and the second semiconductor layer.

* * * * *